(12) United States Patent
Choi et al.

(10) Patent No.: US 6,653,228 B2
(45) Date of Patent: Nov. 25, 2003

(54) METHOD FOR PREPARING SEMICONDUCTOR INCLUDING FORMATION OF CONTACT HOLE USING DIFLUOROMETHANE GAS

(75) Inventors: Sung-Gil Choi, Yongin (KR); Tae-Hyuk Ahn, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 43 days.

(21) Appl. No.: 09/995,747

(22) Filed: Nov. 29, 2001

(65) Prior Publication Data

US 2002/0064945 A1 May 30, 2002

(30) Foreign Application Priority Data

Nov. 29, 2000 (KR) .................... 2000-0071705

(51) Int. Cl.[7] .................. H01L 21/4763; H01L 21/311; H01L 21/302
(52) U.S. Cl. ................. 438/637; 438/253; 438/396; 438/639; 438/640; 438/696; 438/713; 438/714; 438/723; 438/725
(58) Field of Search ............... 438/253, 396, 438/637, 638, 639, 640, 696, 723, 725, 714

(56) References Cited

U.S. PATENT DOCUMENTS

| | | | | |
|---|---|---|---|---|
| 5,681,773 A | * | 10/1997 | Tseng | 438/396 |
| 5,719,089 A | * | 2/1998 | Cherng et al. | 438/637 |
| 5,904,154 A | * | 5/1999 | Chien et al. | 134/1.2 |
| 5,942,803 A | * | 8/1999 | Shim et al. | 257/774 |
| 6,214,747 B1 | * | 4/2001 | Chou et al. | 438/780 |
| 6,492,279 B1 | * | 12/2002 | Becker et al. | 438/714 |

FOREIGN PATENT DOCUMENTS

| | | | | |
|---|---|---|---|---|
| JP | 3-019220 | * | 1/1991 | H01L/21/3205 |
| KR | 97-77894 | | 12/1997 | |
| KR | 10 2000 0045339 | | 7/2000 | |

* cited by examiner

Primary Examiner—Amir Zarabian
Assistant Examiner—Toniae M. Thomas
(74) Attorney, Agent, or Firm—Lee & Sterba, P.C.

(57) ABSTRACT

A method for forming a contact hole in a semiconductor device includes the steps of forming a polymer layer on an upper portion and a side wall of photo resist mask, while etching an oxide layer under the photoresist mask to form a contact hole that uses an etchant gas comprising $CH_2F_2$ gas; and etching the oxide layer while stopping the supply of $CH_2F_2$ gas to the etching process.

10 Claims, 9 Drawing Sheets

METHOD FOR PREPARING SEMICONDUCTOR INCLUDING FORMATION OF CONTACT HOLE USING DIFLUOROMETHANE GAS

CROSS REFERENCE

This application claims the benefit of Korean Patent Application No. 2000-71705, filed on Nov. 29, 2000, under 35 U.S.C. §119, the entirety of which is hereby incorporated by reference.

BACKGROUND OF THE INVENTION

1. Field of the Invention

The present invention relates to a method for preparing a semiconductor, more particularly, relates to a method for forming a contact hole using a $CH_2F_2$ gas that is capable of preventing a photoresist mask from losing a side wall of the mask by forming a polymer layer having a predetermined depth on the upper portion and side wall of the photoresist.

2. Description of Related Art

Methods of forming highly integrated semiconductor devices of a layered type are known. In order to insulate each of the layered devices, a layered insulator is formed.

As can be seen, in the conventional method for forming a bit line of a semiconductor device, the properties of the semiconductor device deteriorate due to void formation between the bit lines and also due to the presence of etching residue at the contact etching.

A process of forming a contact hole in a semiconductor device also becomes difficult due to increasing the aspect ratio and decreasing the thickness of the photoresist used in the process. Furthermore, the aspect ratio is decreased due to decreasing the area of the photoresist because the space between the contact holes becomes narrow. As the aspect ratio is decreased, an open portion is opened due to damage to the contact upper portion.

And, in the case of etching the anti-reflection layer (ARL) formed on the upper portion of the oxide, when a non-uniformly formed polymer layer is used in etching the successive oxide layer, a striation occurs because the non-uniformities in the polymer layer are transcripted (FIGS. 2A and 2B).

Moreover, as shown in FIG. 2A, the striation occurring in the state of after develop inspection (ADI) is accelerated by washing the oxide before the subsequent doping of silicon (Si), and the bridge occurs after the separation of the storage nodes as shown in FIG. 2B.

FIGS. 1A to 1C are cross sectional drawings of a contact hole of a semiconductor formed according to a conventional process disclosed in Korean Patent Application No. 1997-77894.

According to this process, in the Korean Patent, an interlayer insulation layer is etched using CO, $CCl_4$ comprising carbon components as main gases in order to form a contact hole. At this time, the carbon components are reacted with the etchant gas and a polymer (Si—C bond) comprising rich carbons when etching the interlayer insulation layer.

FIGS. 1A to 1C are cross-sectional drawings of forming a contact hole of a semiconductor device according to a conventional art.

First, as shown in FIG. 1A, a field oxide layer is formed on an upper portion of the semiconductor (11) and a field region and a device forming region are separated. A gate oxide layer (not shown), a polysilicon (13) and an insulation layer (15) are sequentially layered on the upper portion of the device forming region and the polysilicon (13), the insulation layer (15) and the gate oxide layer are etched. And, an insulation spacer (15') is formed on both sides of a structure having the polysilicon (13) and the insulation layer (15)

Next, an etching process is performed using an etchant gas that comprises CO, $CCl_4$ as main gases and Ar, $N_2$, He, etc., and a carbon component is injected into the insulation spacer (15') and the insulation layer (15)

Next, as shown in FIG. 1B, an etching mask pattern (150) is formed in order to form the contact hole after forming the interlayer insulation layer.

Next, as shown in FIG. 1C, the interlayer insulation layer is etched using the etching mask pattern (150) and, at this time, the etching process uses $CF_4$, $CHF_3$, $C_2F_6$, $C_3F_8$, $C_4F_8$, $CH_2F_2$ and $NF_3$ gases.

The carbon components injected into the insulation spacer (15') and the insulation layer (15) are reacted with the etchant gas and a polymer (SiC bonds) comprising rich carbon is formed.

Because the polymer comprising rich carbon quite reduces an etching rate of the insulation spacer (15') and the interlayer insulation layer (15), as shown in FIG. 1C, a portion of "A" remains.

Subsequently, an insulation spacer (151) is formed in the contact hole and a conductive pattern is formed in the semiconductor (11).

There are problems that the method performs two etching processes in order to form the contact hole and the process is complicated because of using different etchant gases in each etching process.

For the foregoing reasons, there is a need for a method for preparing a semiconductor device in which damage to the contact hole upper portion due to a loss of the side wall of the mask is prevented.

SUMMARY OF THE INVENTION

In accordance with one respect of the present invention, there is provided a method of forming a contact hole in a semiconductor device that includes the steps of: forming a polymer layer on an upper portion and a side wall of photo resist mask, while etching an oxide layer under the photoresist mask to form a contact hole that uses an etchant gas comprising $CH_2F_2$ gas and etching the oxide layer while stopping the supply of $CH_2F_2$ gas to the etching process.

Semiconductor devices produces according to the inventive methods are also provided.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFFERED EMBODIMENTS

The inventive method for preparing a semiconductor includes the steps of forming a polymer layer on an upper portion and a side wall of a phothresist mask, while etching an underlying oxide layer, using a plasma etching process that employs an etchant comprising $CH_2F_2$ gas, when forming a contact hole of the semiconductor device, such as a one cylinder storage (OCS) hole of a contact type, and then etching the oxide layer while stopping the supply of $CH_2F_2$ gas.

Reference will now be made in detail to a preferred embodiment of the present invention, example of which is illustrated in the accompanying drawings.

FIGS. 3A to 3D and FIG. 4 are cross-sectional views illustrating the formation of a contact hole of a semiconductor device according to a preferred embodiment of the present invention.

Figure 1A:
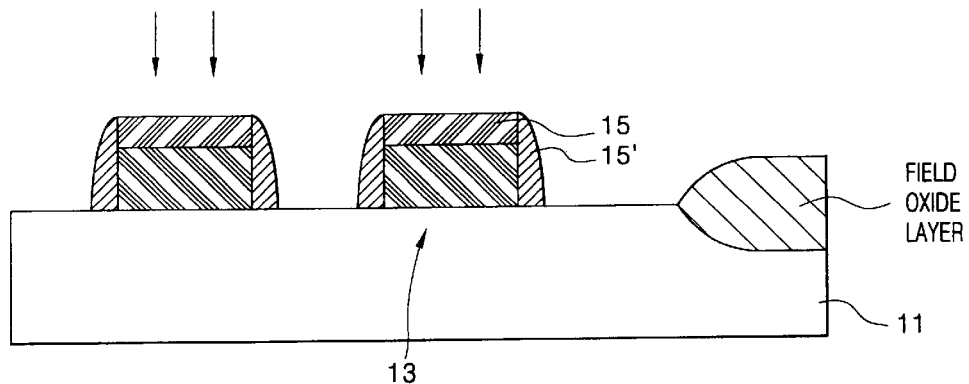
FIGS. 1A to 1C are cross-sectional drawings of forming a contact hole of a semiconductor device according to a conventional art.
Figure 1B:
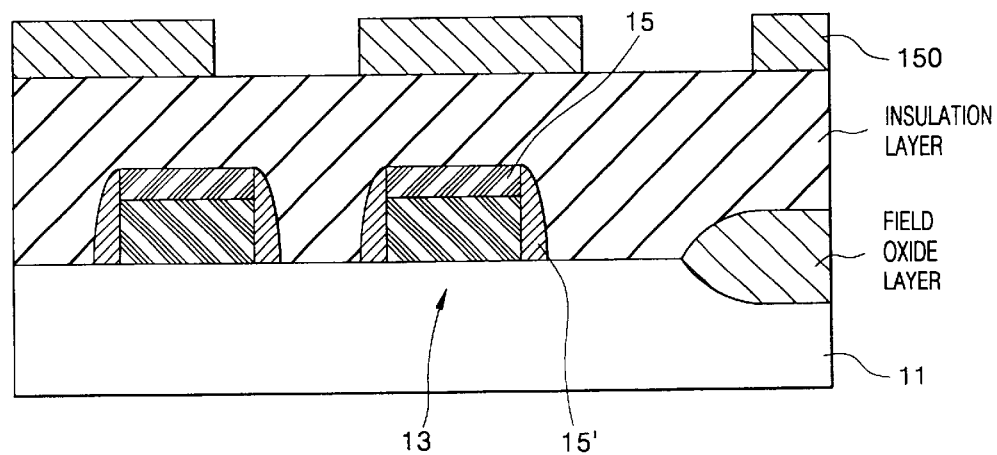
Figure 1C:
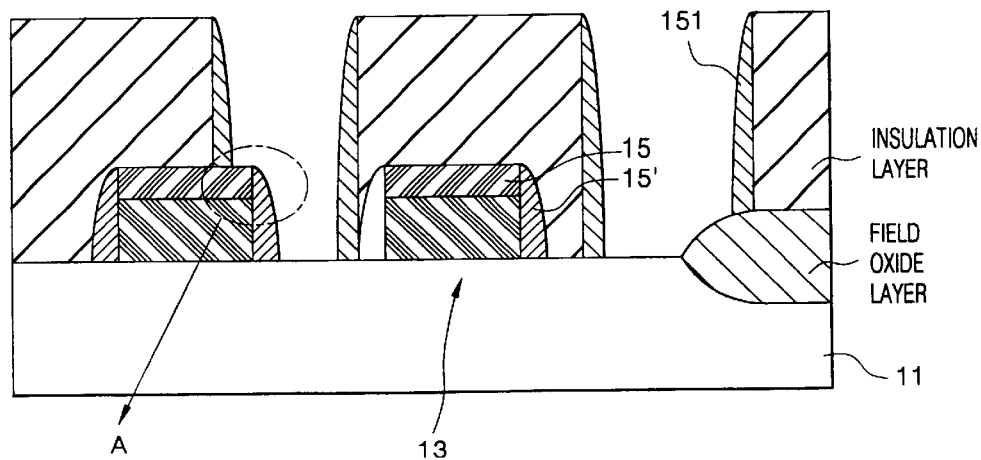
Figure 2A:
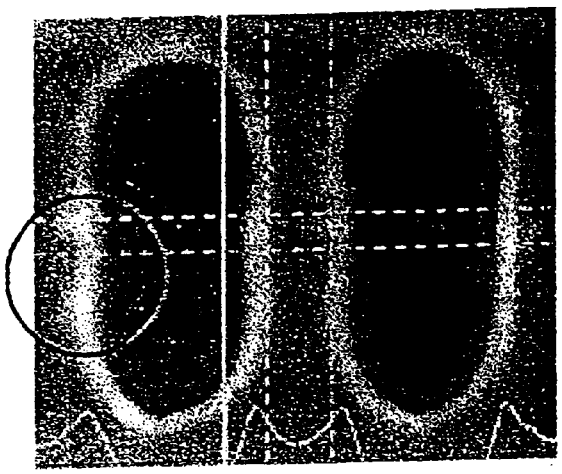
FIGS. 2A and 2B are profiles representing a formation that a striation occurs in the semiconductor device etched according to the conventional art.
Figure 2B:
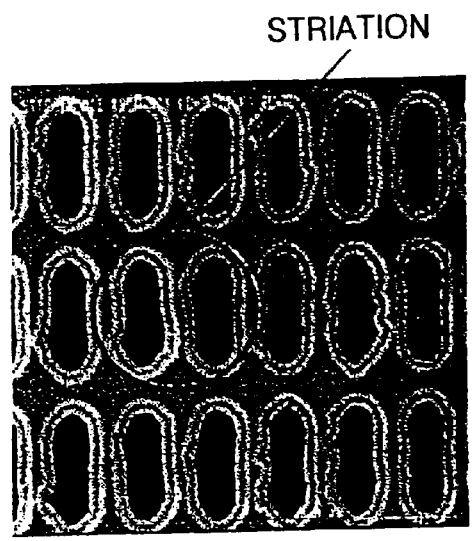
Figure 3A:
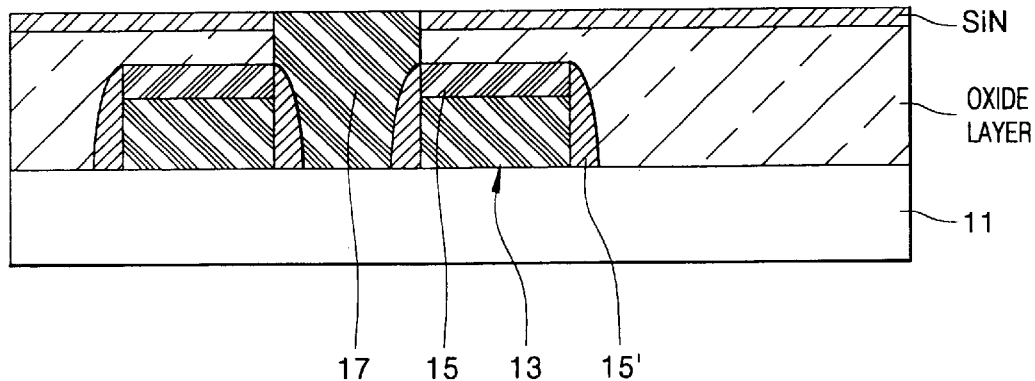
FIGS. 3A to 3D are an across-sectional view of structure of semiconductor device layered before a first etching process according to a preferred embodiment of the present invention.
Figure 3B:
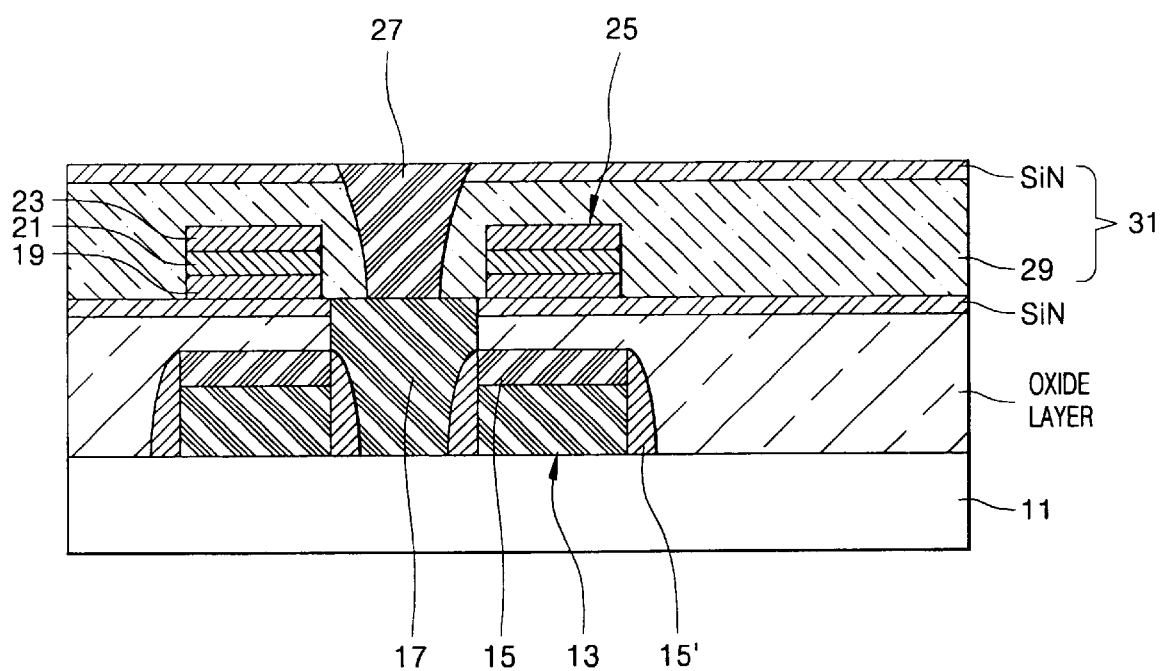

Firstly, as shown in FIG. 3A, a gate (13) having spacers (15') on both sides, a tungsten suicide (WSi) layer (15) over the gate (13), and a self-aligned contact (SAC) (17) are formed on a semiconductor substrate (11) by a well-known method. Then, as shown in FIG. 3B, a first insulation layer 29 comprising a bit line contact pad (BC pad) (27) connected to a capacitor and a bit line (25) having a polysilicon (19), tungsten silicide (WSi; 21) and an anti-reflection layer (ARL; 23) is formed on the semiconductor substrate.

That is, the polysilicon (19), the tungsten silicide (21), anti-reflection layer (31) and a mask oxide (29) are layered on the semiconductor (11) having the gate (13). And then, a photoresist (not shown) is coated on the whole semiconductor (11). At this time, the photoresist (not shown) is patterned to form a photoresist mask (not shown) by an exposure and a photolithography process using a bit line mask.

Subsequently, an etching process is performed to form the bit line (25) on the first insulation layer (29) by an well-known method and to form the bit line contact pad (27) connected to the capacitor.

At this time, a layered structure of the polysilicon layer 19 and the tungsten silicide 21 is called polycide; the tungsten silicide 21 can be replaced with another metal silicide having a high melting point.

Figure 3C:
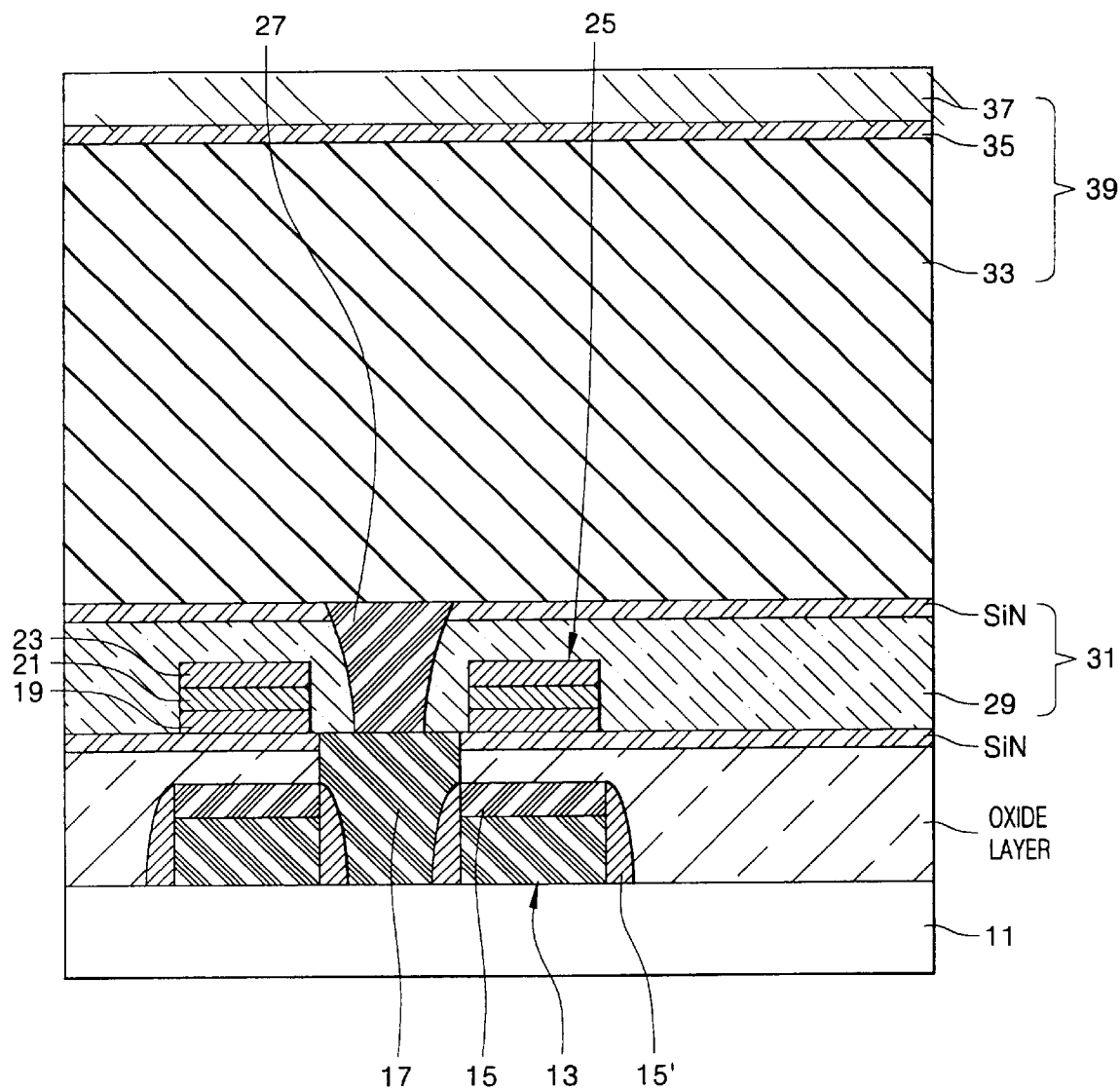

Next, as shown in FIG. 3C, a mask oxide (33), an anti-reflection layer (35) and photoresist (37) are sequentially layered on the whole first insulation layer (31) and a second insulation layer (39) is formed. The photoresist mask is patterned to form a photoresist mask (not shown).

Figure 3D:
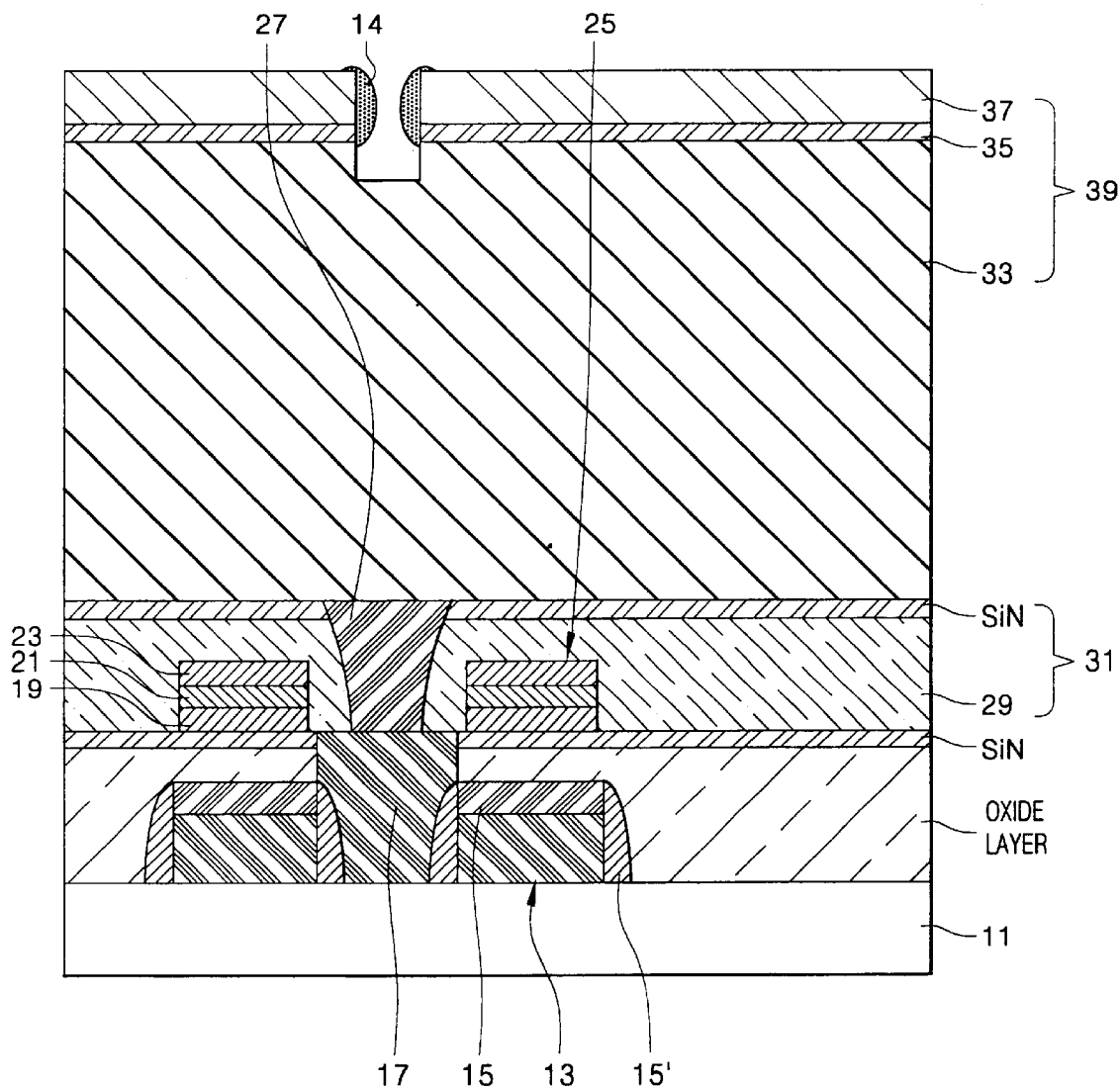

And then, as shown in FIG. 3D, in a first etching step, when the mask oxide layer 33 is etched to a predetermined depth using the photoresist mask, by a plasma etching process employing $CH_2F_2$ gas, a layer comprising a polymer 14 is formed in a predetermined depth on the upper portion and the side walls of the photoresist mask 37. Thus, the second insulation layer is formed.

In the case of etching the mask oxide layer 33 and the ARL 35, a common plasma etchant and $CH_2F_2$ gas are provided together.

The plasma etching process is a process using a common etchant, that is, a gas comprising carbon or fluorine; preferably the common etchant comprises $CHF_3$. Preferably, the $CH_2F_2$ gas is supplied at a rate of about 10 to about 100 sccm.

The first etching step is preferably carried out for about 40 to 80 seconds and more preferably for about 60 seconds.

At this time, the polymer 14 is layered on the upper portion and the side wall of the photoresist mask 37, and simultaneously the lower portion of the oxide layer 33 is etched by 2,000 to 6,000 Å and preferably 4,000 to 5,000 Å.

The polymer 14 layered on the upper portion and the side wall of the photoresist mask 37 by the etching process protects the upper portion of the photoresist mask 37 and the upper portion of the contact hole 43 from damage due to the loss of the side wall.

Figure 4:
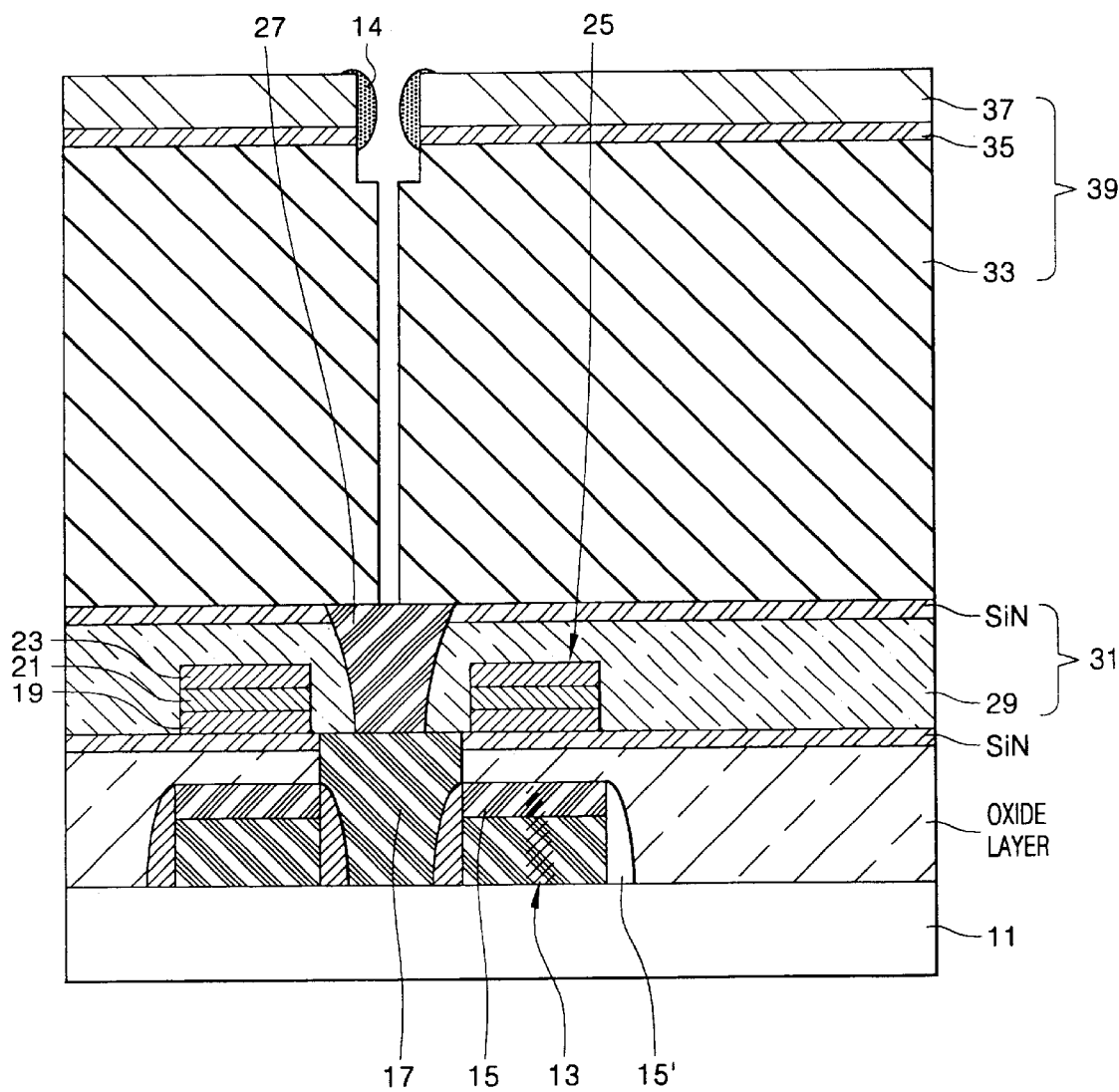
FIG. 4 is an across-sectional view of structure of semiconductor device layered after a first etching process according to the preferred embodiment of the present invention.

As shown in FIG. 4, in a second etching step, the etching process proceeds using only the common etchant, while the supply of $CH_2F_2$ gas is stopped.

The etching depth of the oxide layer is preferably 6,000 to about 15,000 Å.

At this time, as shown in FIG. 4, because the polymer produced in the first etching process fully plays a role as the mask, consumption of the photoresist is decreased, the striation is protected, and simultaneously the etching of the oxide layer 33 can be advanced.

The second etching step uses a common plasma etchant, more preferably the same etchant used in the first etching step, but does not use $CH_2F_2$ gas.

Figure 8A:
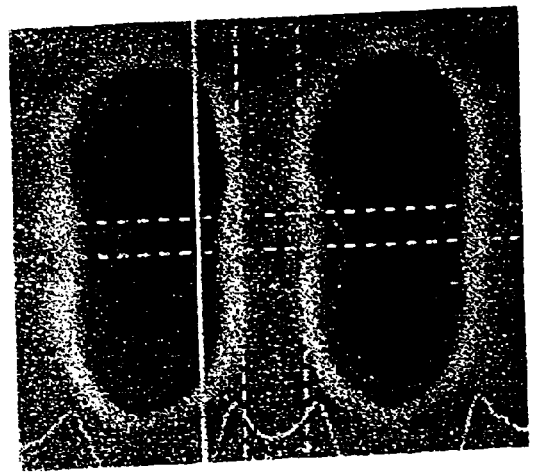
FIG. 8A is a profile representing an occurrence of striation in the semiconductor device.
Figure 8B:
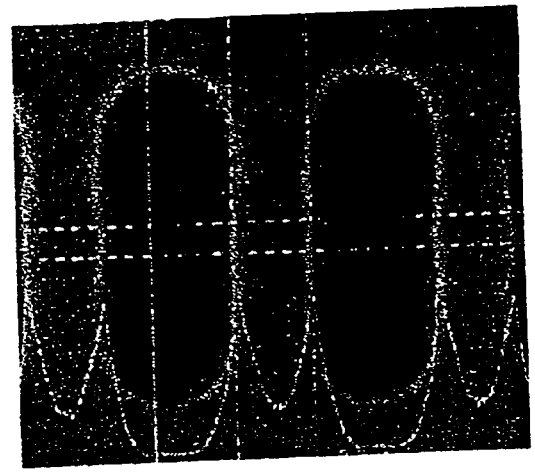
FIG. 8B is a profile representing semiconductor device etched according to the foregoing preferred embodiment of the present invention.

FIG. 4 is a drawing representing a cross-section of a semiconductor device prepared according to the foregoing process, and FIG. 8B is a profile view of the upper erosion of the contact and the striation for such a device.

As shown in FIG. 8B, there is no appearance of the upper portion erosion of the contact and the striation as in the prior art.

Figure 5A:
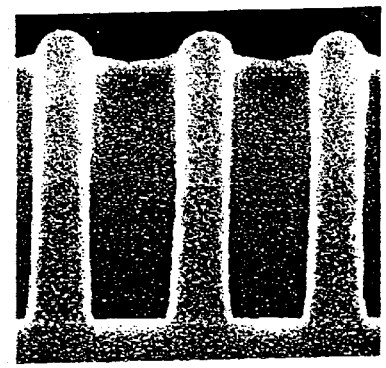
FIGS. 5A and 5B are profiles representing a polymer layer formed in the upper portion and the side wall of a photoresist mask in the state of after develop inspection (ADI)
Figure 5B:
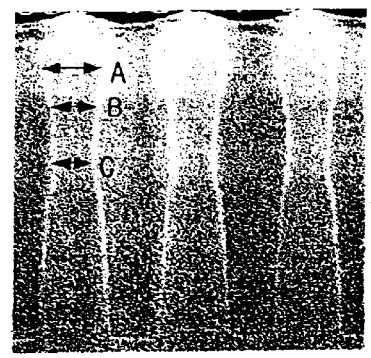

On the other hand, as shown in FIG. 5B, when the upper layer and the oxide layer are deposited, the polymer is deposited on the photoresist mask, the oxide layer being linearly etched according to the deposition time of the polymer.

Figure 5C:
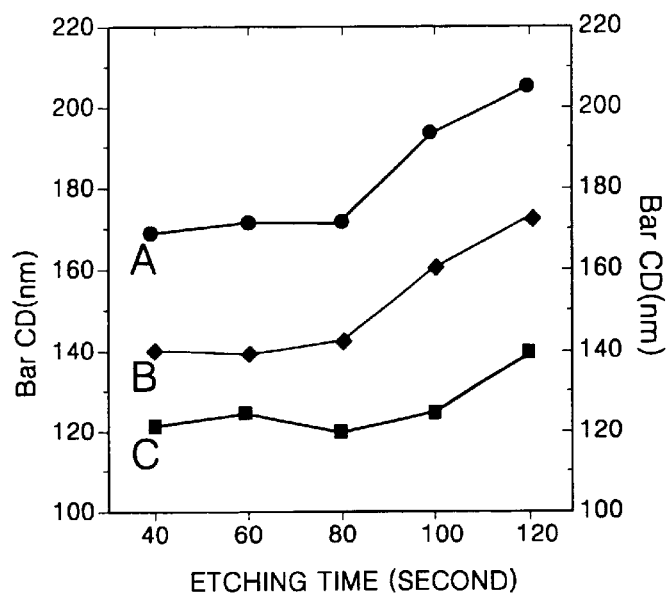
FIG. 5C is a graph representing a quantity of polymer according to a time of layering polymer to the preferred embodiment of the present invention.

As shown in FIG. 5C, when the deposition quantity of the polymer according to the etching time of the ARL layer is compared with the depth of the lower oxide layer detected by critical dimension (CD), the deposition quantity of the polymer increases according to the etching time, but, a hole CD dose not increase.

Figure 6:
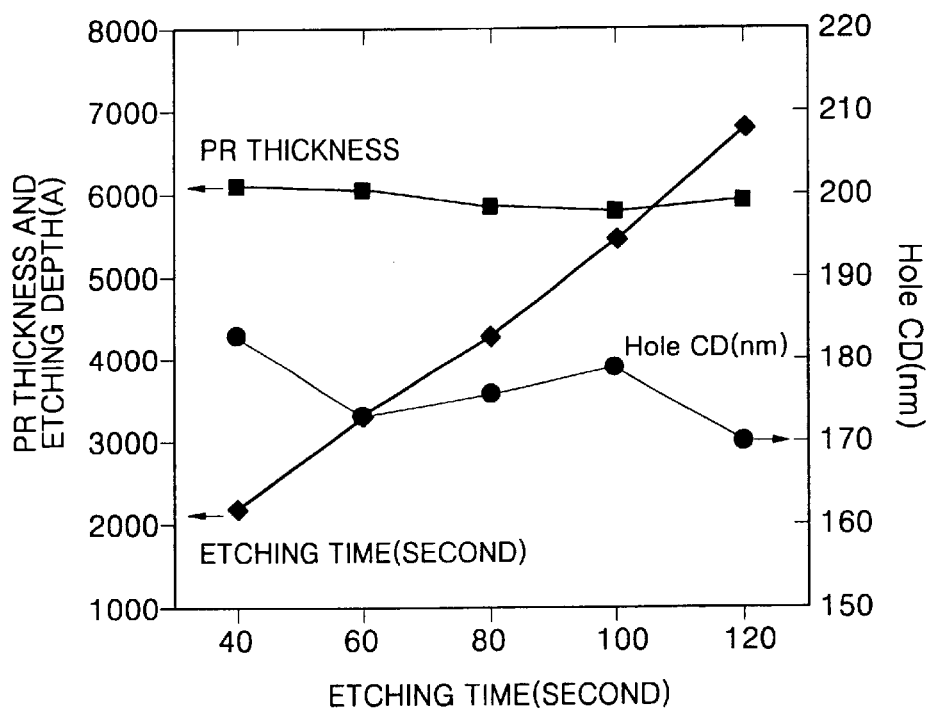
FIG. 6 is a graph representing the etching depth of an oxide versus etching time.

Further, as shown in FIG. 6, another advantage of the present invention is that top erosion by the mask according to the non-uniform deposition of the polymer and a shortage of selectivity of the photoresist because of the etching degree of the oxide layer linearly increases, in spite of the fact that the consumption of the photoresist is the same as before due to the attachment of the polymer.

Figure 7:
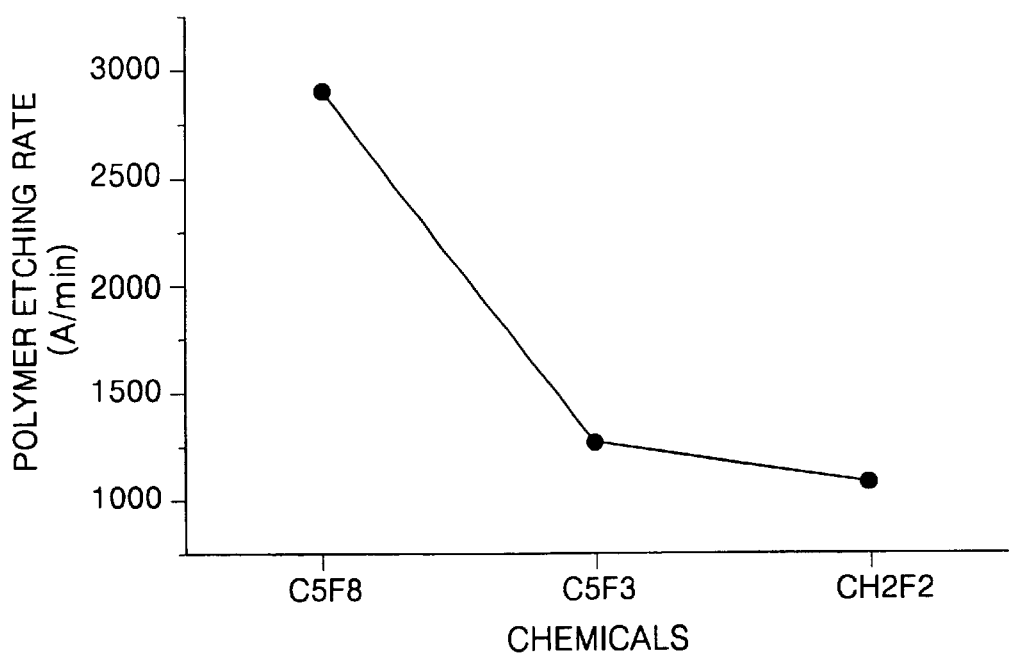
FIG. 7 is a graph representing the plasma tolerance of the polymer for each of the chemicals according to the foregoing preferred embodiment of the present invention.

Also, FIG. 7 is a graph representing results of an analysis of the etching tolerance of the polymer to each of the chemicals present during the etching process. It is known that the polymer produced in a plasma gas comprising $CH_2F_2$ gas has good etching tolerance.

The results of the analysis are obtained as follows.

The plasma tolerance of each of the chemicals is compared according to the etching rate by etching the oxide layer in the same condition of the deposition of each of the chemicals on bare silicon (Si). The polymer produced in the plasma comprising $C_5F_8$ gas is etched a rate of about 2,900 Å/minute. In contrast, the polymer produced in the plasma comprising $CH_2F_2$ gas is etched a rate of about 1,250 Å/minute. Thus, the polymer produced in the plasma comprising $CH_2F_2$ gas has good etching tolerance.

As described herein before, when the top erosion and striation are estimated in the real products, as shown in FIGS. 8A and 8B, it is known that the etching process in the present invention substantially prevents top erosion and striation in the semiconductor device.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for forming a contact hole in a semiconductor device, comprising the steps of:

(i) forming a polymer layer on an upper portion and a side wall of photo resist mask, while etching an oxide layer under the photoresist mask to form a contact hole that uses an etchant gas comprising $CH_2F_2$ gas; and (ii) etching the oxide layer while stopping the supply of $CH_2F_2$ gas to the etching process.

2. The method of claim 1, wherein the etching process of the steps (i) and (ii) is a plasma etching process.

3. The method of claim 1, wherein the same etchant gas is used in steps (i) and (ii).

4. The method of claim 1, wherein the etchant gas is a gas comprising at least one of carbon and fluorine.

5. The method of claim 3, wherein the etchant gas is $CHF_3$.

6. The method of claim 1, wherein in step (ii) the flow quantity of $CH_2F_2$ gas is about 10 to about 100 sccm.

7. The method of claim 1, wherein in the step (i), the oxide layer is etched to a depth of about 2,000 to about 6,000 Å.

8. The method of claim 1, wherein in the step (i), the oxide layer is etched for about 40 to about 80 seconds.

9. The method of claim 1, wherein in the step (ii), the oxide layer is etched to a depth of about 6,000 to about 15,000 Å.

10. A semiconductor device prepared according to the method of claim 1.

* * * * *